(12) United States Patent
Khaja et al.

(10) Patent No.: US 8,658,513 B2
(45) Date of Patent: Feb. 25, 2014

(54) ISOLATION BY IMPLANTATION IN LED ARRAY MANUFACTURING

(75) Inventors: Fareen Adeni Khaja, Gloucester, MA (US); Deepak Ramappa, Cambridge, MA (US); San Yu, Westford, MA (US); Chi-Chun Chen, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 61 days.

(21) Appl. No.: 13/098,942

(22) Filed: May 2, 2011

(65) Prior Publication Data

US 2011/0275173 A1    Nov. 10, 2011

Related U.S. Application Data

(60) Provisional application No. 61/331,069, filed on May 4, 2010, provisional application No. 61/348,962, filed on May 27, 2010.

(51) Int. Cl.
*H01L 21/76* (2006.01)

(52) U.S. Cl.
USPC .......................................... 438/407; 438/423

(58) Field of Classification Search
USPC ................ 257/88, 90, 93, 100, 266, E33.064; 438/407, 423
See application file for complete search history.

(56) References Cited

U.S. PATENT DOCUMENTS

| | | | |
|---|---|---|---|
| 6,547,249 B2 | 4/2003 | Collins et al. | |
| 6,998,642 B2 | 2/2006 | Lin et al. | |
| 7,985,970 B2 * | 7/2011 | Ibbetson et al. | 257/77 |
| 2001/0028084 A1 * | 10/2001 | Mo | 257/330 |
| 2002/0139987 A1 * | 10/2002 | Collins et al. | 257/88 |
| 2005/0167719 A1 * | 8/2005 | Chen et al. | 257/301 |
| 2005/0224822 A1 | 10/2005 | Liu | |
| 2008/0179602 A1 * | 7/2008 | Negley et al. | 257/88 |
| 2008/0211416 A1 * | 9/2008 | Negley et al. | 315/193 |
| 2008/0251796 A1 * | 10/2008 | Lee et al. | 257/88 |
| 2009/0008723 A1 * | 1/2009 | Schmidt | 257/409 |
| 2009/0104726 A1 | 4/2009 | Slater et al. | |

FOREIGN PATENT DOCUMENTS

WO   2008091837 A3   7/2008

* cited by examiner

*Primary Examiner* — Lex Malsawma

(57) ABSTRACT

An improved method of creating LED arrays is disclosed. A p-type layer, multi-quantum well and n-type layer are disposed on a substrate. The device is then etched to expose portions of the n-type layer. To create the necessary electrical isolation between adjacent LEDs, an ion implantation is performed to create a non-conductive implanted region. In some embodiments, an implanted region extends through the p-type layer, MQW and n-type layer. In another embodiment, a first implanted region is created in the n-type layer. In addition, a second implanted region is created in the p-type layer and multi-quantum well immediately adjacent to etched n-type layer. In some embodiments, the ion implantation is done perpendicular to the substrate. In other embodiments, the implant is performed at an angle.

16 Claims, 7 Drawing Sheets

ISOLATION BY IMPLANTATION IN LED ARRAY MANUFACTURING

This application claims priority to U.S. Provisional Patent Application Ser. No. 61/331,069 filed May 4, 2010 and U.S. Provisional Patent Application Ser. No. 61/348,962 filed May 27, 2010, the disclosures of which are incorporated by reference in their entireties.

FIELD

This invention relates to fabrication of light emitting diodes (LEDs) and, more particularly, to ion implantation of LEDs.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

LEDs are built on a substrate and are doped with impurities to create a p-n junction. A current flows from the p-side, or anode, to the n-side, or cathode, but not in the reverse direction. Electrons and holes flow into the p-n junction from electrodes with different voltages. If an electron meets a hole, it falls into a lower energy level and releases energy in the form of a photon. The wavelength of the light emitted by the LED and the color of the light may depend on the band gap energy of the materials forming the multiple quantum well (MQW).

Array LEDs are gaining more attention due to the system level cost advantage of AC array LEDs for general lighting applications. For example, the use of a plurality of LEDS arranged in a series configuration may allow higher voltages, and even AC voltage (i.e. 120V). However, isolating the individual LEDs in the array may be difficult and existing manufacturing techniques may cause leakage currents in the LEDs. These leakage currents may be the result of damage caused by etching during formation of an LED mesa. Reactive ion etching (RIE) may be used to create these mesas and etch the interleaving regions between the mesas or LEDs. These LED mesas are defined to isolate individual LEDs or physically separate the LEDs.

Isolating the various LEDs in an array may separate these LEDs electrically, which allows the individual LEDs to be connected in series. FIG. 1 is a cross-sectional view of a lateral AC LED array in series configuration. The LED array 100 has a buffer layer 102 disposed on a substrate 101. In some embodiments, this buffer layer is made using GaN. An n-type layer 103 is disposed on this buffer layer 102. A multiple quantum well (MQW) 104 and p-type layer 105 are disposed on the n-type layer 103. The p-type layer 105 and n-type layer 103 may be, for example, GaN or AlGaInP. The MQW 104 may be GaInN or AlGaInP. A transparent conductive layer (TCL), such as ITO (indium tin oxide) 106, and a p-contact 107 are disposed on the p-type layer 105. An n-contact 108 is disposed on the n-type layer 103.

Inductively coupled plasma (ICP) etching is usually used to create etched region 109 which separates first LED 111 and second LED 112. This etch region typically removes the p-type layer 105, the MQW 104, the n-type layer 103, and the buffer layer 102, so as to create electrical separation between the adjacent LEDs 111,112. The TCL 106, the p-type 105 and the MQW 104 are also formed at a width less than that of the n-type layer 103, so as to allow attachment of an n-contact 108 on the n-type layer 103.

A connection 110, which may be a metal or conductor, connects the first LED 111 to the second LED 112 and bridges the etched region 109. Each of the first LED 111 and second LED 112 may be located within or on a mesa. The etched region 109 may define the air bridge where the connection 110 connects the n-type layer 103 of the first LED 111 to the p-type layer 105 of the second LED 112.

The connection 110 is conductive and therefore must be isolated from the tiered layers of the LEDs 111, 112. For example, if the connection 110 contacts the n-type layer 103 of the second LED 112, as well as the p-contact 107, the second LED 112 will be short-circuited. To minimize this, the etched region 109 may be hollow or filled with air or a polymer. The entire LED array 100 may be encapsulated in a dielectric layer in one particular embodiment.

In addition, the use of ICP has multiple drawbacks. First, ICP uses complicated etch chemistries, which may be expensive. Second, the ICP leaves damage that may increase leakage currents. Third, ICP potentially limits device density due to the anisotropic etch. Fourth, post-ICP treatments may be required to treat any damage from the ICP, which increases the number of manufacturing steps and lowers throughput. Fifth, the LED mesas may vary in dimension or have different cross-sectional areas due to etching, which affects LED performance.

Accordingly, there is a need in the art for an improved LED structure and methods of LED ion implantation that is cost effective, provides a yield improvement, and improves reliability of LED arrays.

SUMMARY

An improved method of creating LED arrays is disclosed. A p-type layer, multi-quantum well and n-type layer are disposed on a substrate. The device is etched to expose portions of the n-type layer. To create the necessary electrical isolation between adjacent LEDs, an ion implantation is performed to create a non-conductive implanted region. In some embodiments, an implanted region extends through the p-type layer, MQW and n-type layer. In another embodiment, a first implanted region is created in the n-type layer. In addition, a second implanted region is created in the p-type layer and multi-quantum well immediately adjacent to etched n-type layer. In some embodiments, the ion implantation is done perpendicular to the substrate. In other embodiments, the implant is performed at an angle.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments are described herein in connection with ion implantation of LEDs, but these embodiments also may be used with other semiconductor manufacturing processes. A beam-line ion implanter, plasma doping ion implanter, or other ion implantation system known to those skilled in the art may be used in the embodiments described herein. Furthermore, the embodiments described herein may apply to many different LED architectures known to those skilled in the art, including lateral or vertical LED arrays different from those disclosed. Thus, the invention is not limited to the specific embodiments described below.

Materials used for LEDs, such as GaN or AlGaInP, may be made more resistive by, for example, physically damaging it with an implant or chemically altering it by implanting species that will poison the implanted region. Physically and/or chemically forming resistive interleaving areas between LEDs may reduce the number of process steps involved in conventional LED fabrication. For example, etching steps or isolation steps may be replaced or eliminated.

Physical damage from the implantation introduces deep level traps in the GaN surface or bulk. These will trap the free carriers in GaN and help create a highly resistive GaN material. Chemical poisoning uses a species that occupies substitutional sites. This creates chemically-induced deep levels in the mid-bandgap and renders the GaN highly resistive.

Figure 1:
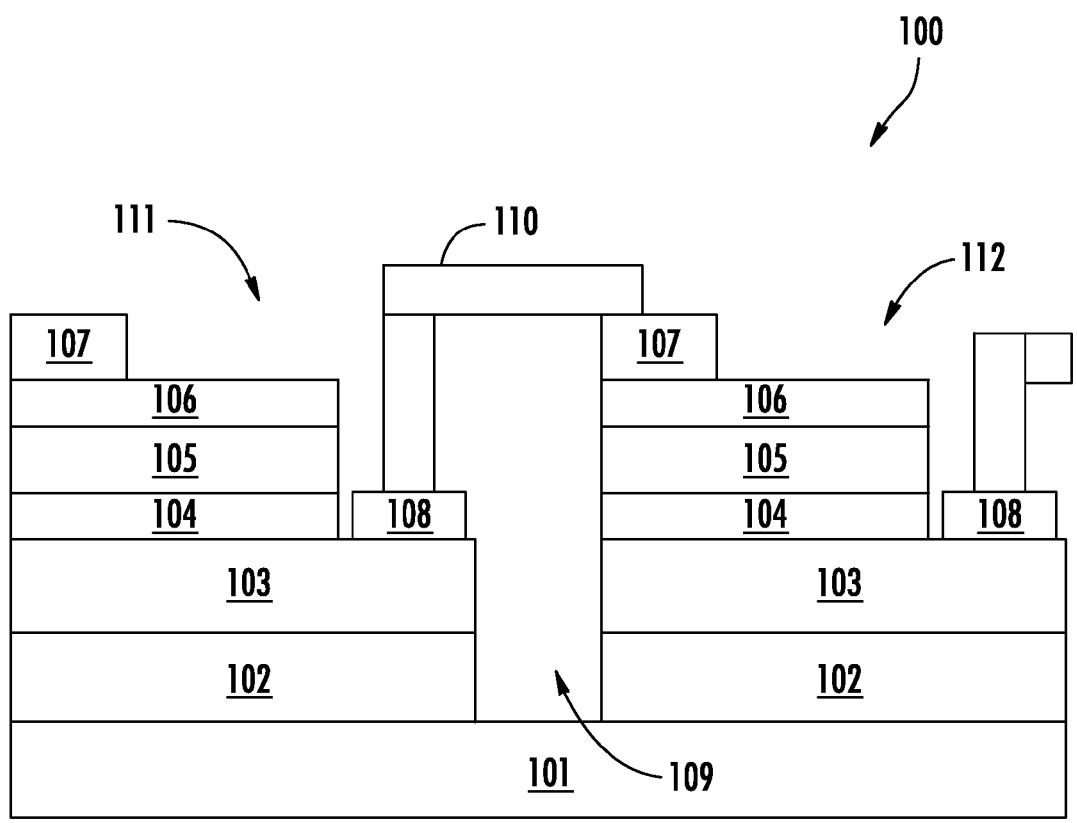
FIG. 1 is a cross-sectional view of a lateral AC LED array of the prior art in series configuration.
Figure 2:
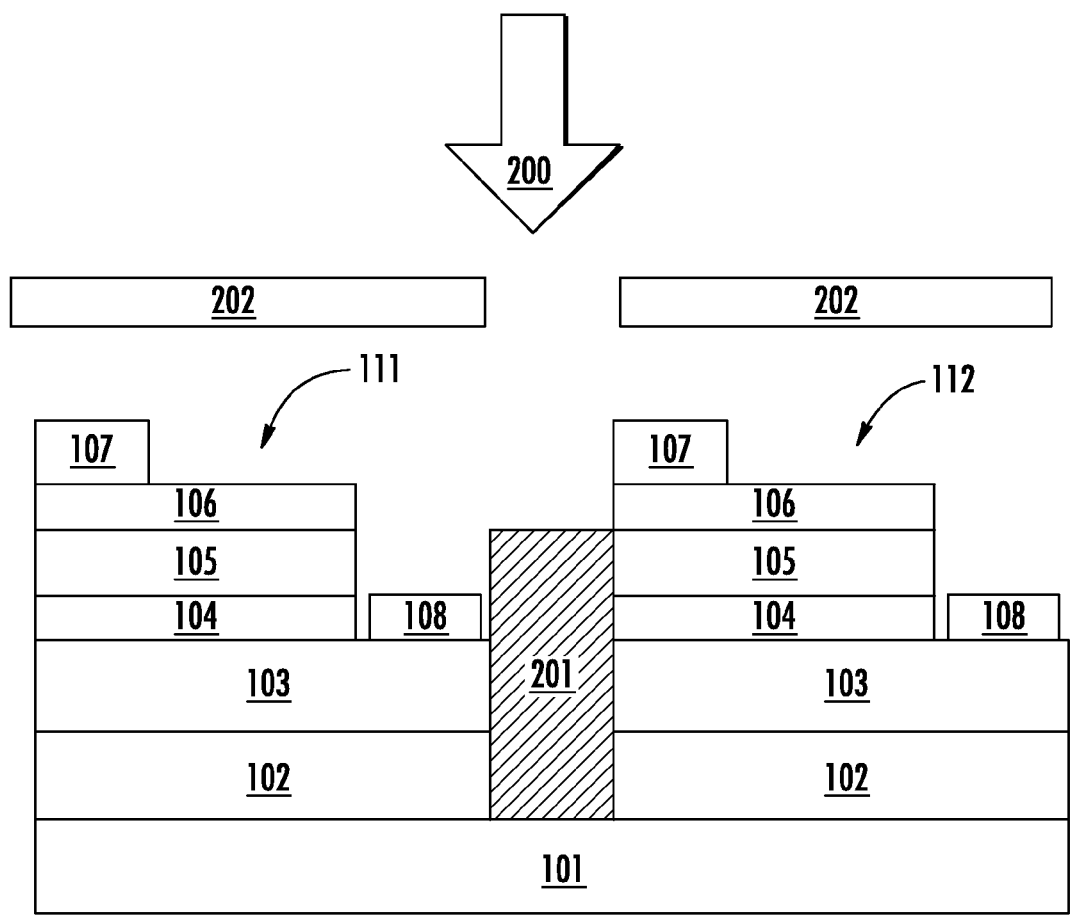
FIG. 2 is a cross-sectional view of a first embodiment of an implanted lateral AC LED array in series configuration.

FIG. 2 is a cross-sectional view of a first embodiment of an implanted lateral AC LED array in series configuration. In this particular embodiment, the n-type layer 103 and buffer layer 102 are not interrupted as illustrated in the embodiment of FIG. 1. In other words, the buffer layer 102 and the n-type layer 103 are continuous on the substrate 101. MQW 104 and p-type layer 105 are formed so as to have spaces between adjacent like layers. This may be done via etching. This arrangement allows portions of the n-type layer 103 to be exposed. The n-type layers 103 and buffer layers 102 of the first LED 111 and the second LED 112 are isolated using the implanted region 201 (represented by the shaded region in FIG. 2). In addition, the exposed sides of p-type layer 105 and MQW 104 are also implanted during this implant process. Ions 200 are implanted to form the implanted region 201. A mask 202, which may be, for example, a stencil or shadow mask, is used to selectively implant only the implanted region 201. Of course, photoresist, oxide layers, or other masks may be used. The implant is performed so as to implant ions into p-type layer 105, MQW 104, n-type layer 103 and buffer layer 102. The implant energy may be modified during the implant to allow ions to reach the various depths with the LED. This implant may performed after the first LED 111 and second LED 112 have been etched. However, in another embodiment, the etching of the p-type layer 105 and the MQW 104 is performed after the ion implant. The implanted region 201 is illustrated as going to the depth of the buffer layer 102, but the substrate 101 also may be implanted. In this embodiment, the ions are directed toward the LED in a direction that is perpendicular to the plane of the substrate 101.

Figure 3:
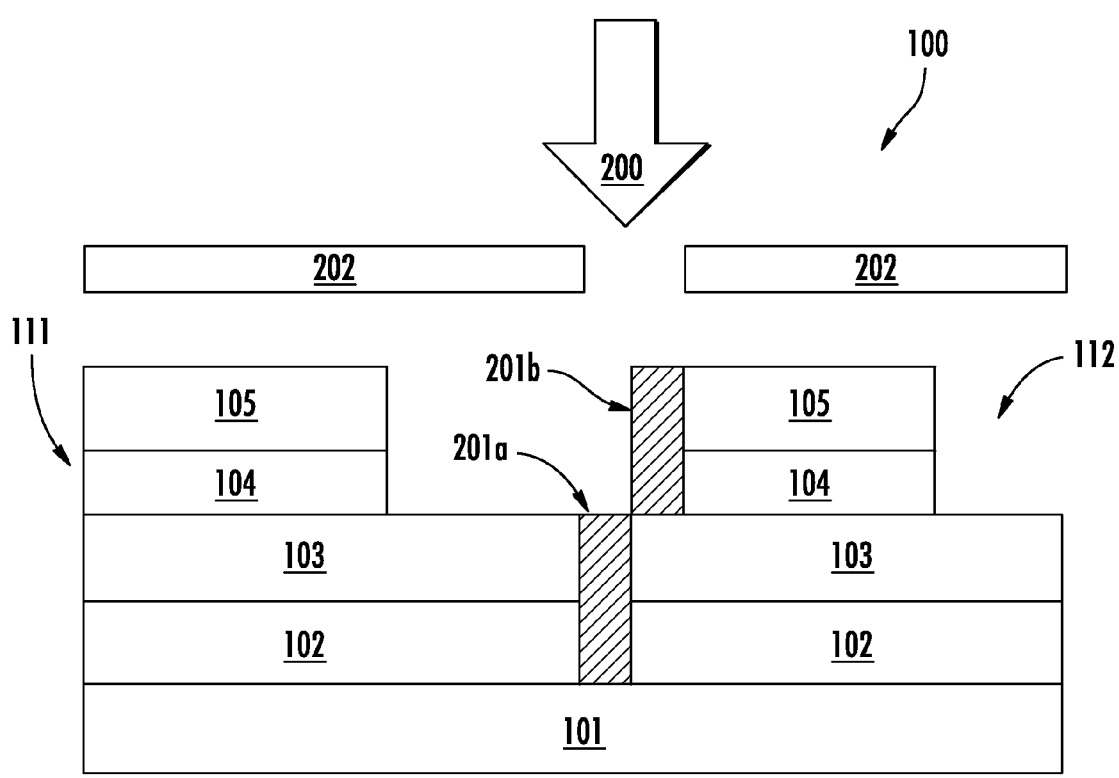
FIG. 3 is a cross-sectional view of a second embodiment of an implanted lateral AC LED array in series configuration.

FIG. 3 is a cross-sectional view of a second embodiment of an implanted lateral AC LED array in series configuration. In this embodiment, ions are not implanted through all four layers (p-type layer 105, MQW 104, n-type layer 103, and buffer layer 102) as was done in the previous embodiment. Rather, some ions are implanted through the n-type layer 103 and the buffer layer 102, while others are implanted in the p-type layer 105 and the MQW 104. In this particular embodiment, the n-type layer 103 and buffer layer 102 are not interrupted as illustrated in the embodiment of FIG. 1. In other words, the buffer layer 102 and the n-type layer 103 are continuous on the substrate 101. MQW 104 and p-type layer 105 are formed so as to have spaces between adjacent like layers. This arrangement allows portions of the n-type layer 103 to be exposed. In FIG. 3, the p-contact 107, n-contact 108, and TCL 106 have not yet been formed. The n-type layers 103 and buffer layers 102 of the first LED 111 and the second LED 112 are isolated using the implanted region 201a (represented by the shaded region in FIG. 3). In addition, the exposed wall of the p-type layer 105 and MQW 104 are isolated using the implanted region 201b, which may be formed at the same time as implanted region 201a. In another embodiments, these implants are performed sequentially. Ions 200 are implanted to form the implanted regions 201a, 201b. A mask 202, which may be, for example, a stencil or shadow mask is used to selectively implant only the implanted region 201. Of course, photoresist, oxide layers, or other masks may be used. The embodiment of FIG. 3 uses a single or chained implant. After the first LED 111 and second LED 112 have been etched to create the p-type layer 105 and MQW 104, the ions 200 are implanted. The implanted region 201a is illustrated as going to the depth of the buffer layer 102, but the substrate 101 also may be implanted. In this embodiment, the ions are directed toward the LED in a direction that is perpendicular to the plane of the substrate 101.

Since the ions are implanted directly from above, it is typical that the implant region 201a formed in the n-type region 103 and buffer layer 102 may be of approximately equal depth to the implant region 201b formed in the p-type layer 105 and the MQW 104 of the second LED 112, if both regions are implanted simultaneously. Therefore, this single implant is most effective when the combined thickness of the n-type layer 103 and the buffer layer 102 is greater than or equal to the combined thickness of the p-type layer 105 and the MQW 104. In that way, the implanted region 201b extends through the p-type layer 105 and the MQW 104 and meets the implanted region 210a in the n-type layer 103. In other words, implant regions 201a, 201b create a continuous wall of insulated material. Furthermore, implant region 201a and implant region 201b contact each other and are continuous.

Figure 4A:
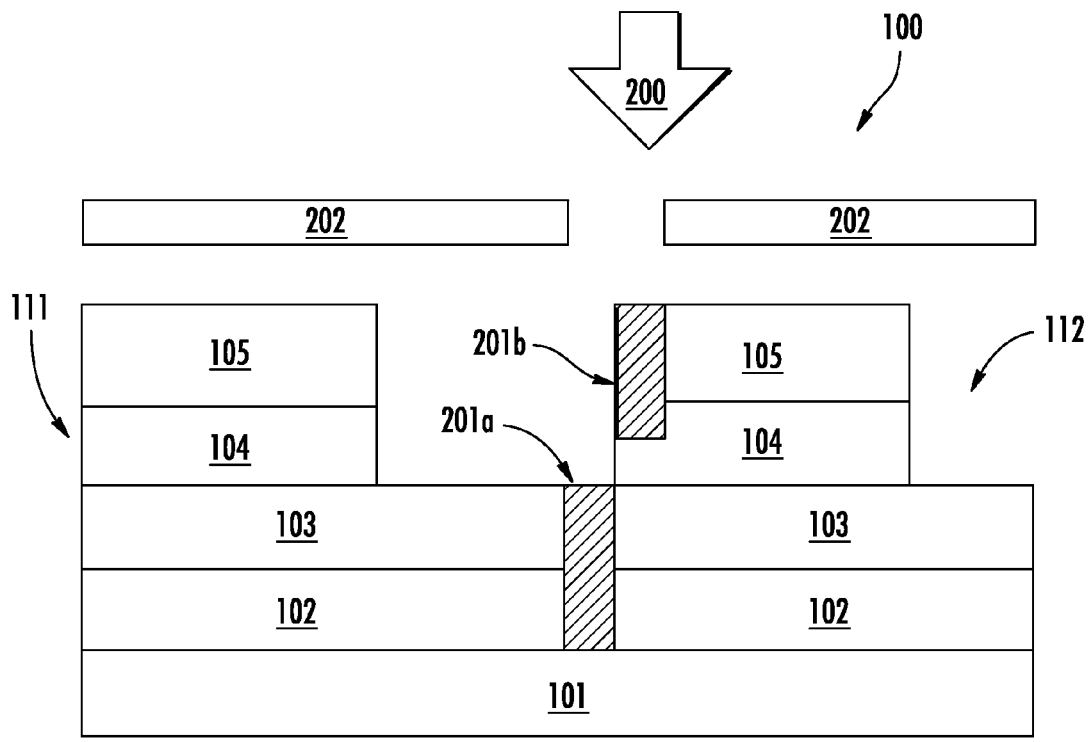
FIGS. 4A-B are cross-sectional views of a third embodiment of an implanted lateral AC LED array in series configuration.

FIG. 4 is a cross-sectional view of a third embodiment of an implanted lateral AC LED array in series configuration. In this particular embodiment, the combined thickness of the p-type layer 105 and the MQW 104 may be greater than the combined thickness of the n-type layer 103 and the buffer layer 102. In this embodiment, two implants may be used. The first implant implants ions 200 perpendicular to the surface of the LED array 100. As shown in FIG. 4A, these ions 200 create an implanted region 201a through the n-type layer 103 and the buffer layer 102, thereby isolating the n-type layer 103 and buffer layer 102 of LED 111 from the n-type layer 103 and buffer layer 102 of LED 112. However, this implant was not able to create an implant region 201b through the p-type layer 105 and MQW 104 that reached the n-type layer 103. Therefore, at least a portion of the MQW 104 (and optionally the p-type layer 105) is not implanted by the first implant.

Figure 4B:
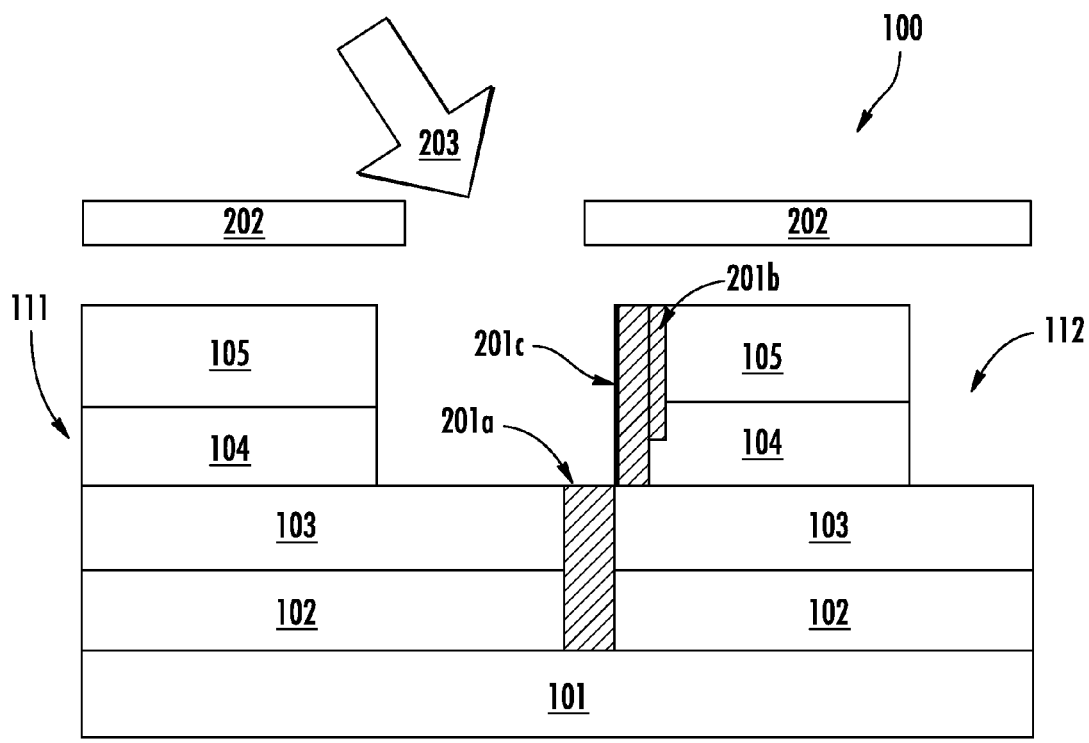

The second implant, shown in FIG. 4B, implants ions 203 at an angle with respect to the surface of the LED array 100. This angle is different than perpendicular. The second implant is used to create an implanted region 201c along the exposed side of the p-type layer 105 and the MQW 104 that separates the first LED 111 from the second LED 112. In some embodiments, ions 203 are implanted into portions of implanted region 201b. In this way, the p-type layer 105 and MQW 104 are implanted with ions so as to create an insulation barrier extending down to the n-type layer 103. These two implants may be separate, chained without breaking vacuum, or at least partially simultaneous. Furthermore, implant region 201a, implant region 201b and implant region 201c contact each other and are continuous.

The depth of the implanted region 201a may be deeper than the thickness of the n-type layer 103 and the buffer layer 102 in one embodiment. The width of the implant 201b into the p-type layer 105 may vary. A box profile may improve isolation effects.

Figure 5:
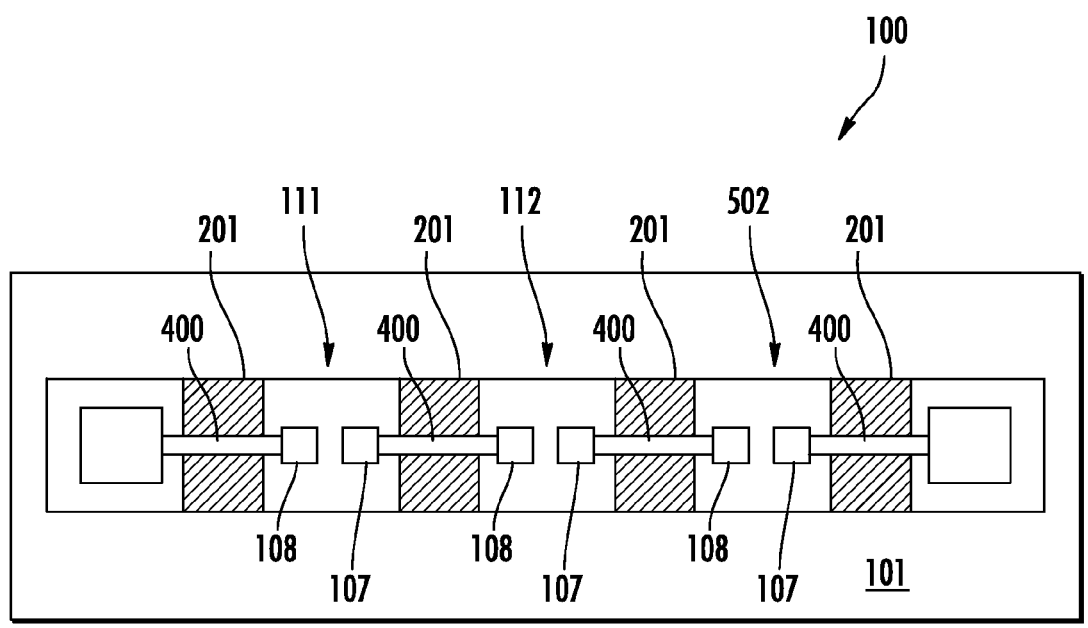
FIG. 5 is a top view of the implanted lateral AC LED Array of any of the previous embodiments.

FIG. 5 is a top perspective view of an LED array according to any of the embodiments. The LED array 100 has a first LED 111, second LED 112, and third LED 502. Each LED may be within or on a mesa. Of course, other numbers of mesas or LEDs are possible. As seen in FIG. 5, the implanted regions 201 separate the first LED 111, second LED 112, and third mesa 502. The p-contacts 107 and n-contacts 108 are connected by the connections 400 that are disposed on, in, or over the implanted regions 201. This LED array 100 in an alternate embodiment may be connected to another series LED array in reverse parallel configuration. In such an embodiment, implantation may separate the two series arrays.

To form the LED array 100, a transparent electrode is formed using blanket metal deposition and applied to the p-GaN layer 105. The metal then has photoresist applied and is defined. The mesas are etched to define the region where the n-contact 108 will be applied. The implantation that forms the implanted regions 201 may then be performed. In the embodiment of FIG. 2, the implant process may be done prior to the etching process. The ion implantation may require an application of photoresist or use of a stencil or shadow mask, for example. After the implant, the p-contact 107 and n-contact 108 are defined by patterned photoresist, metal deposition, and liftoff.

In another embodiment, the implant is performed with the etching step. A lithography pattern is applied and etching begins. A shallow implant that amorphizes the etched walls to remove surface etch damage may then be performed. This may be a low energy implant with rotation to enable implants of all corners of the trench. In yet another embodiment, implantation may occur during the epitaxial growth process to form isolation regions.

Figure 6:
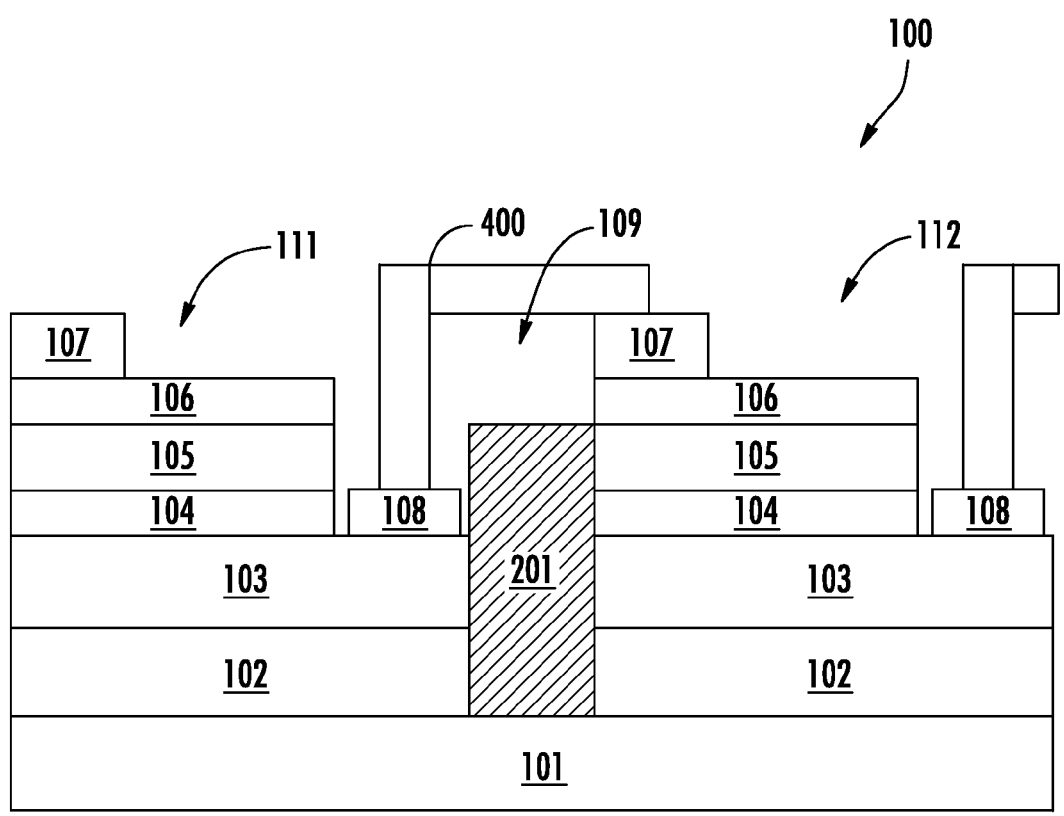
FIG. 6 is a cross-sectional view of a connected, implanted lateral AC LED array in series configuration using the embodiment shown in FIG. 2.

FIG. 6 is a cross-sectional view of a connected, implanted lateral AC LED array in series configuration, using the embodiment of FIG. 2. The implanted region 201 separates the first LED 111 from the second LED 112. After the implanted regions 201 have been created, the transparent conductive layer 106 is added. The p-contact 107 and n-contact 108 are applied to the transparent conductive layer 106 and the n-type layer 103, respectively. An interconnection electrode 400 connects the p-contact 107 of the second LED 112 to the n-contact 108 of the first LED 111. This interconnection electrode 400 may be fabricated above the LED array 100 using an air bridge. Such an interconnection electrode 400 may be formed using evaporation, deposition, or coating methods. In one specific instance, a paste may be used. In yet another embodiment, the air bridge illustrated in FIG. 6 may not be used with the implanted regions 201, such that the interconnection electrode 400 is applied directly to the LED.

Figure 7:
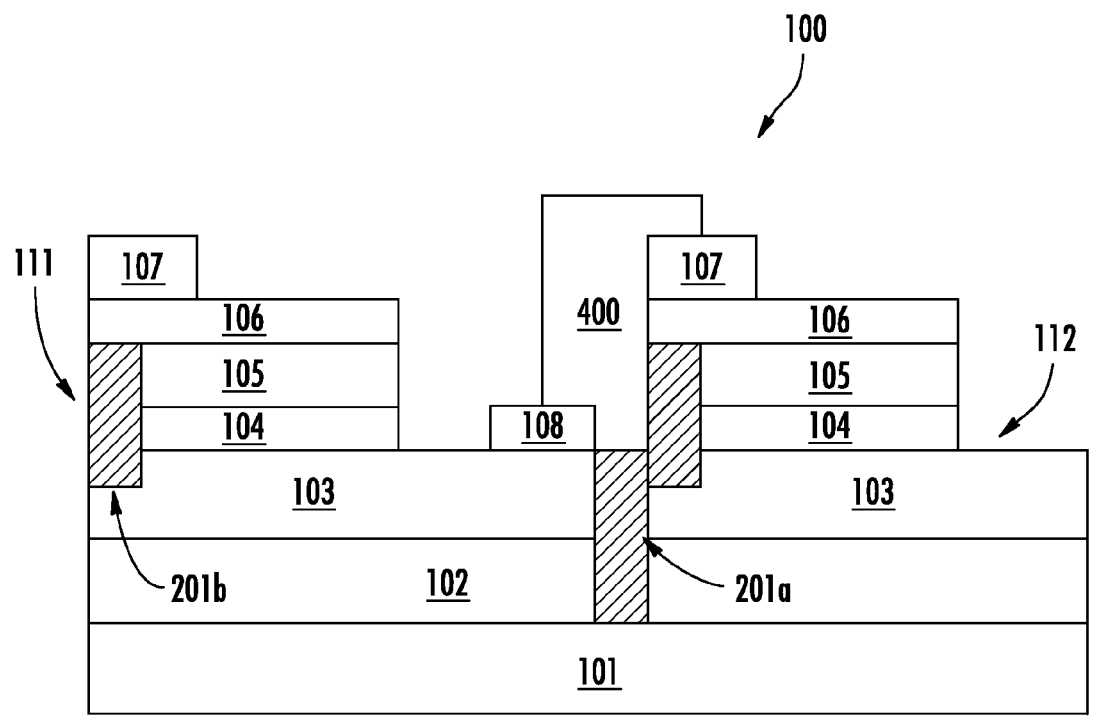
FIG. 7 is a cross-sectional view of a connected, implanted lateral AC LED array in series configuration, using the embodiment shown in FIG. 3 or FIG. 4.

FIG. 7 is a cross-sectional view of a connected, implanted lateral AC LED array in series configuration, using the embodiments of FIG. 3 or FIG. 4. The implanted region 201a separates the first LED 111 from the second LED 112. After the implanted regions 201 have been created, the transparent conductive layer 106 is added. The p-contact 107 and n-contact 108 are applied to the transparent conductive layer 106 and the n-type layer 103, respectively. An interconnection electrode 400 connects the p-contact 107 of the second LED 112 to the n-contact 108 of the first LED 111. This interconnection electrode 400 may be fabricated directly on the LED array 100 without an air bridge, which may improve reliability. Such an interconnection electrode 400 may be formed using evaporation, deposition, or coating methods. In one specific instance, a paste may be used. In yet another embodiment, the air bridge illustrated in FIG. 1 may be used with the implanted regions 201.

To perform the implants described, ions such as H, N, He, Ar, O, Cr, Fe, Ne, F, Ti, other heavy ions like Zn, or other species known to those skilled in the art may be implanted into GaN or AlGaN/GaN epitaxial layers to isolate LEDs. In one particular embodiment, the dose is 1E14 and the implant energy varies with the desired implant depth or thickness of the various layers in the LED. High energy implants, such as those in the MeV range, may be used if the implant has to penetrate n-GaN layers and buffer layers to a depth of approximately 3 μm to 5 μm with a dose of approximately 1E15. Chained implants with multiple different energies also may be performed to create a dopant profile at different depths. These chained implants may be performed without breaking vacuum in one embodiment. In another embodiment, the implants may be performed at room temperature or a cold temperature that is below room temperature. To prevent implantation into various regions of the LED, photoresist, another hard mask such as an oxide, or a shadow or stencil mask may be used. Thus, a selective or patterned implant may be performed.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of manufacturing a lateral AC LED array, having a plurality of LEDs arranged in a series configuration, comprising:
   creating a device having a substrate, a buffer layer closest to the said substrate, a n-type layer disposed on said buffer layer, a multi-quantum well disposed on said n-type layer, and a p-type layer disposed on said multi-quantum well;
   etching a region of said p-type layer and said multi-quantum well, so as to expose said n-type layer in said etched regions, whereby said etched region separates said multi-quantum well and said p-type layer of a first LED from said multi-quantum well and said p-type layer of an adjacent second LED and said n-type layer is not separated between said first LED and said second LED;

implanting ions into a first portion of said buffer layer and a first portion of said n-type layer of said first LED, which is exposed in said etched region, said first portion adjacent to said p-type layer and said multi-quantum well of said second LED to create a first implanted region;

implanting ions into a second portion of said buffer layer and a first portion of of said p-type layer and said multi-quantum well of said second LED, to create a second implanted region, wherein said second portion is immediately adjacent to said first portion, wherein the second implanted region is created after creating the first implanted region;

applying a p-contact electrically connected to said p-type layer of said second LED and a n-contact electrically connected to said exposed n-type layer of said first LED; and using an interconnection electrode to electrically connect said p-contact of said second LED and said n-contact of said first LED.

2. The method of claim 1, wherein said implanting ions into said first portion is performed by directing ions perpendicular to said substrate.

3. The method of claim 1, wherein said implanting ions into said second portion is performed by directing ions perpendicular to said substrate.

4. The method of claim 1, wherein said implanting ions into said second portion is performed by directing ions at an angle different than perpendicular to said substrate.

5. The method of claim 1, wherein said implanting ions into said first portion and said implanting ions into said portion are performed simultaneously.

6. The method of claim 1, wherein said n-type layer has a thickness and said first implanted region extends through said thickness of said n-type layer.

7. The method of claim 1, wherein said n-type layer has a thickness and said first implanted region extends beyond said thickness of said n-type layer.

8. The method of claim 1, wherein said p-type layer and said multi-quantum well have a combined thickness and said second implanted region extends through said combined thickness.

9. The method of claim 1, wherein said p-type layer and said multi-quantum well have a combined thickness and said second implanted region does not extend through said combined thickness.

10. The method of claim 9, further comprising implanting ions at an angle different than perpendicular into said p-type layer and said multi-quantum well to create a third implanted region such that said first implanted region, said second implanted region and said third implanted region are continuous.

11. A method of manufacturing a lateral AC LED array, having a plurality of LEDs arranged in a series configuration, comprising:

creating a device having a substrate, a buffer layer closest to the said substrate, a n-type layer disposed on said buffer layer, a multi-quantum well disposed on said n-type layer, and a p-type layer disposed on said multi-quantum well;

etching a region of said p-type layer and said multi-quantum well, so as to expose said n-type layer in said etched regions, whereby said etched region separates said multi-quantum well and said p-type layer of a first LED from said multi-quantum well and said p-type layer of an adjacent second LED and said n-type layer is not separated between said first LED and said second LED;

using a mask to selectively implant ions into a first portion of said buffer layer and a first portion of said n-type layer of said first LED which is exposed in said etched region, to create a first implanted region and into a second portion of said p-type layer and said multi-quantum well of said second LED, to create a second implanted region, wherein said second portion is immediately adjacent to said first portion, wherein said ions are directed perpendicular to said substrate wherein the second implanted region is created after creating the first implanted region;

applying a p-contact electrically connected to said p-type layer of said second LED and a n-contact electrically connected to said exposed n-type layer of said first LED; and using an interconnection electrode to electrically connect said p-contact of said second LED and said n-contact of said first LED.

12. The method of claim 11, wherein said n-type layer has a thickness and said first implanted region extends through said thickness of said n-type layer.

13. The method of claim 11, said n-type layer has a thickness and said first implanted region extends beyond said thickness of said n-type layer.

14. The method of claim 11, wherein said p-type layer and said multi-quantum well have a combined thickness and said second implanted region extends through said combined thickness.

15. The method of claim 11, wherein said p-type layer and said multi-quantum well have a combined thickness and said second implanted region does not extend through said combined thickness.

16. The method of claim 15, further comprising using a mask to selective implant ions at an angle different than perpendicular into a third portion of said p-type layer and said multi-quantum well, to create a third implanted region, prior to said applying step, whereby said first implanted region, said second implanted region and said third implanted regions are continuous.

* * * * *